United States Patent [19]

Macovski

[11] Patent Number: 4,579,121

[45] Date of Patent: Apr. 1, 1986

[54] HIGH SPEED NMR IMAGING SYSTEM

[76] Inventor: Albert Macovski, 2505 Alpine Way, Menlo Park, Calif. 94025

[21] Appl. No.: 467,661

[22] Filed: Feb. 18, 1983

[51] Int. Cl.⁴ .............................................. A61B 5/04
[52] U.S. Cl. .................................... 128/653; 324/309
[58] Field of Search ......... 128/653; 324/309, 313–314

[56] References Cited

U.S. PATENT DOCUMENTS

| 4,254,778 | 3/1981 | Clow et al. | 324/314 X |
| 4,284,948 | 8/1981 | Young | 324/309 |
| 4,290,019 | 9/1981 | Hutchison et al. | 324/309 X |
| 4,339,718 | 7/1982 | Young | 324/309 |
| 4,443,760 | 4/1984 | Edelstein et al. | 324/314 X |
| 4,451,788 | 5/1984 | Edelstein et al. | 324/309 |

Primary Examiner—Kyle L. Howell
Assistant Examiner—Francis J. Jaworski
Attorney, Agent, or Firm—Flehr, Hohbach, Test Albritton & Herbert

[57] ABSTRACT

A cross-sectional image of the NMR activity in the body is formed by taking a sequence of projections, each having a different transverse gradient structure. Following each excitation the spins in the cross section are driven back to equilibrium. For imaging relaxation times, the sequence of projection signals are processed so as to represent an acquisition at a specific desired time.

49 Claims, 8 Drawing Figures

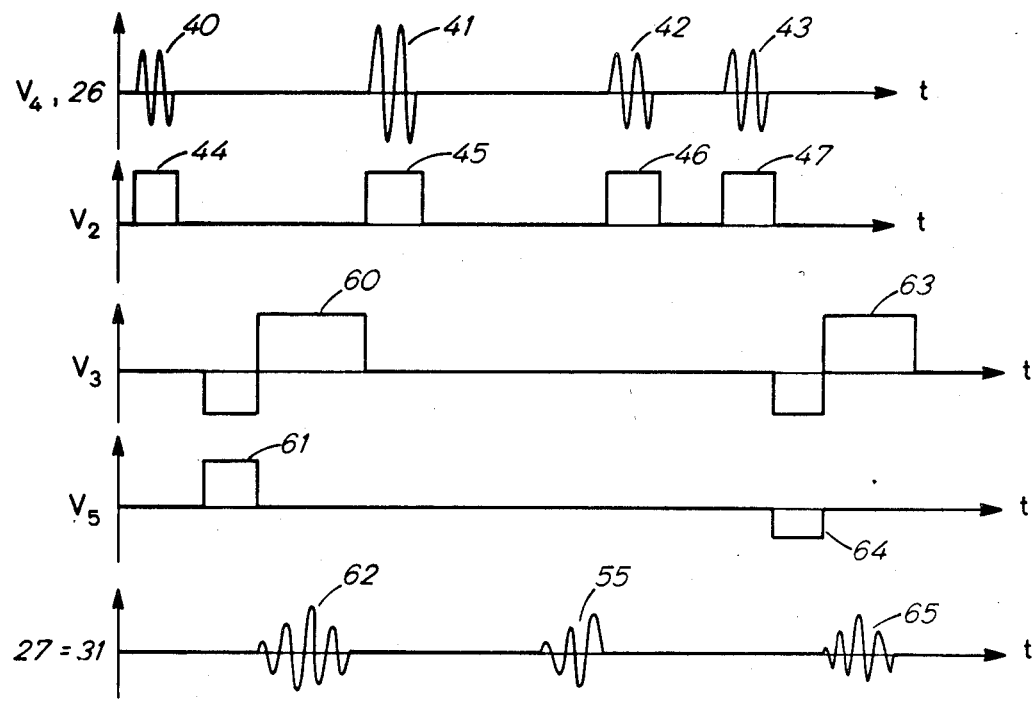
FIG. 3.
FIG. 4.
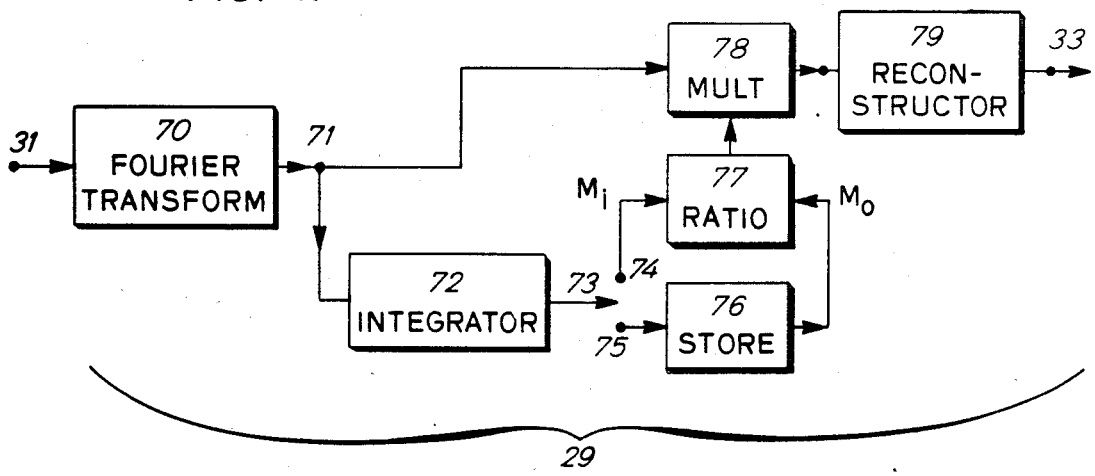

HIGH SPEED NMR IMAGING SYSTEM

BACKGROUND OF THE INVENTION

1. Field of the Invention

This invention relates to medical imaging systems using nuclear magnetic resonance. In a primary application the invention relates to high speed cross-sectional imaging of the body. Other applications include the imaging of various relaxation times.

2. Description of Prior Art

Nuclear magnetic resonance, abbreviated NMR represents a new approach to medical imaging. It is completely non-invasive and does not involve ionizing radiation. In very general terms, magnetic moments are excited at specific spin frequencies which are proportional to the local magnetic field. The radio frequency signals resulting from the decay of these spins are received using pickup coils. By manipulating the magnetic fields, an array of signals are provided representing different regions of the volume. These are combined to produce a volumetric image of the density of the body.

A descriptive series of papers on NMR appeared in the June 1980 issue of the *IEEE Transactions on Nuclear Science*, Vol. NS-27, pp. 1220–1255. The basic concepts are described in the lead article, "Introduction to the Principles of NMR" by W. V. House, pp. 1220–1226.

A number of three-dimensional methods are described. One important one is described by P. V. Lauterbur and C. M. Lou entitled, "Zeugmatography by Reconstruction from Projections," pp. 1227–1231. In this approach, a linear field gradient is superimposed on the strong axial magnetic field. As a result of the gradient, each plane in the volume, in a direction normal to the gradient, experiences a different resonant frequency. A burst, containing a spectrum of frequencies, is used to simultaneously excite each of the planes. The received signal, following the excitation, is then Fourier transformed into its individual components. The amplitude at each frequency represents a planar integration of the proton density. This process can be repeated using a gradient field in different directions to collect information about arrays of planes. These planar integrals can be used to produce two-dimensional projection images of a volume or, alternatively, three-dimensional information about the proton density of each voxel in the volume.

The projection image is obtained by obtaining the integrated density of substantially all planes which are normal to the plane of the projection image. The total number of planes required, at all angles and positions, is substantially equal to the number of pixels in the two-dimensional projection range. The reconstruction procedure involves the classical reconstruction from projections widely used in current computerized tomography systems. The most generally used procedure is that of convolution-back projection.

Three-dimensional reconstructions are made which provide cross-sectional images. The approach taken in the Lauterbur paper involves making an array of two-dimensional projection images at every angle through the object. Lines in these projection images represent line integrals or projections of cross-sectional planes of the object. Thus, again using classical reconstruction techniques, any desired cross-sectional plane can be reconstructed.

A second general method of acquiring and processing NMR imaging data is described in a paper by E. R. Andrew entitled "Nuclear Magnetic Resonance Imaging: The Multiple Sensitive Point Method" pp. 1232 to 1238 of the same issue. In this method, a selective system is used which acquires data from individual voxels in the volume of interest. This is accomplished using dynamically varying fields for the gradients. In general, with these dynamic fields, all but the small region not containing the time-varying field integrates to zero. Thus, if time varying fields of different frequencies are applied to three orthogonal axes, only a single point or voxel will not be time-varying. The signal will therefore represent solely that point without requiring reconstruction from projections.

The difficulty with this system is that it requires a very long data acquisition time since the signal is taken from one voxel at a time. Sufficient time must be spent at each voxel to provide an adequate signal to noise ratio. This problem is alleviated by using dynamic gradients on two axes and a static gradient on the third axis. Thus, in the direction of the third axis, each position again corresponds to a different frequency. Using wideband excitation and Fourier transforming the received signal the frequency spectra simultaneously provide the density of an array of voxels along a line. The line is that corresponding to the intersection of the two orthogonal dynamic gradients where all but a single line averages to zero.

Although this method avoids the motion artifacts caused by reconstruction from projections, it continues to provide a relatively long data acquisition time with the resulting blurring from physiological motions including respiratory and cardiovascular.

A third imaging method is also line or point selective and is described in a paper by L. E. Crooks entitled, "Selective Irradiation Line Scan Techniques for NMR Imaging" of pp. 1239–1244 of the same issue. This general approach has a number of variations. In one, a selective pulse is used to excite a single plane of interest using a static gradient and an appropriately shaped pulse. The resulting signal from the excited plane is stored. Following equilibrium an orthogonal plane is excited with a higher intensity such that the magnetization is inverted or made negative. Irradiation of this type produces no received signal. The first step is then repeated by selectively exciting the plane of interest and storing the resultant signal. In this case, however, a line in the plane of interest will be missing since it has been saturated by the high intensity excitation of a plane orthogonal to the plane of interest. Thus the line of intersection is not included in the resultant signal. A simple subtraction of the first and second stored signals represents the line of intersection. By measuring different lines at many angles and positions in the plane of interest, using this subtraction procedure, a reconstructed image of the plane is made using classical reconstruction from projection techniques.

An alternative approach using the same line intersection of orthogonal planes avoids the subtraction operation. In this case the orthogonal plane is immediately excited with inverting radiation. The line of intersection is affected so as to produce a spin echo signal at a later time. Thus, at this later time, the signal represents the desired line only. Again, an array of line integral signals are used to provide a cross-sectional image.

Similar sensitive point and sensitive line methods have been suggested which result in saturation of all but a specific plane of interest. This is immediately followed by a similar excitation in an orthogonal direction which saturates everything in the plane except a line. Either the line integral signal can be acquired, or a third orthogonal excitation can be used to acquire the signal from a point or voxel. Saturation is achieved by a relatively long "burn" radio frequency pulse, in the presence of a gradient, which demagnetizes the region corresponding to the frequencies excited. This procedure is described in a paper by A. N. Garroway, P. K. Granell and P. Mansfield, "Image Formation in NMR by a Selective Irradiative Process," which appeared in *J. Phys. C: Solid State Physics*, Vol. 7, 1974, pp. L457–L462.

An additional approach to NMR imaging is described in a recent book entitled *Nuclear Magnetic Resonance Imaging In Medicine*, published in 1981 by Igaku-Shoin, Ltd., Tokyo. Chapter 3 of this book, by Lawrence E. Crooks, provides an overview of the various imaging techniques. In addition to those already mentioned there is another planar integration approach described on pp. 44–47. Here, each plane integral is phase encoded by applying a gradient normal to the plane. When the gradient is removed, the nuclei along the plane have cyclical phase distributions, depending on the strength of the magnetic field. By acquiring these planar integrals using phase distributions with different spatial frequencies, information is acquired about each line in the plane. This information is decoded again using Fourier transforms. This approach has been termed spin warp imaging.

Another approach has recently been reported on, which also provides cyclical distributions along a plane. In this case, however, the cyclical variations are achieved by imposing a gradient on the intensity of the r.f. excitation field. If the gradient is made strong enough, cyclical variations will occur across the plane where the regions of 90° excitation will provide a maximum response and those of 0° and 180° will have no response. As before, a series of excitation with gradients of varying intensities provides cyclical variations at different spatial frequencies which can be transformed to reconstruct the distribution within the selected plane. This process is described in a paper by D. I. Hoult entitled, "Rotating Frame Zeugmatography," which appeared in *Phil. Trans. R. Soc. London*, B289:543–547 (1980).

An additional image sequence, which is used in some of the present commercial instruments, is described in a paper by I. R. Young, et al., entitled, "Magnetic Resonance Properties of Hydrogen: Imaging of the Posterior Fossa," *American Journal of Radiology*, Vol. 137, pp. 895–901, Nov. 1981. Here a single excitation burst is used to select the desired plane. This burst takes place in the presence of a z gradient, so that the burst frequency selects a specific xy plane in the volume. Immediately following the burst, when the FID signal is being received, the z gradient is turned off and a transverse gradient applied. This results in each line in the plane, normal to the transverse gradient, generating a different frequency. For cross-sectional imaging this sequence is repeated with the transverse gradient rotated to different angles so as to provide a complete set of projections. The reconstruction is accomplished by classical methods of reconstruction from projections, such as filtered back projection.

In general, all of the methods described require on the order of minutes to produce the desired cross-sectional image. This is basically because the section of interest is excited a large number of times. The time between each excitation is approximately $T_1$, the spin lattice relaxation time which is of the order of 1.0 seconds. This scan time of minutes is undesirable for a number of reasons. The basic physiological movements of the body and the various patient movements blur the image, thus seriously reducing its quality. Also, patients are uncomfortable in attempting to remain immobile for this long time period. In addition, these approaches preclude producing motion pictures demonstrating the various physiological motions such as the beating heart.

One effort at overcoming these problems was suggested in a paper by P. Mansfield and I. L. Pykett in the *Journal of Magnetic Resonance*, Vol. 29, 1978, p. 355. A system is described known as echo-planar imaging where, in a single FID, the information from an entire plane is derived. Although the image acquisition time becomes extremely rapid, since each region is excited only once, and a relatively wide bandwidth is used, the resultant images have poor s.n.r. and poor resolution.

Therefore at present, all of the available commercial instruments require a few minutes to produce a cross-sectional image which clearly limits their applicability.

SUMMARY OF THE INVENTION

An object of this invention is to provide a high-speed method of obtaining cross-sectional NMR images.

A further object of this invention is to provide a high-speed method of obtaining cross-sectional images of NMR relaxation times.

A further object of this invention is to provide cross-sectional NMR images with improved signal-to-noise ratio.

A further object of this invention is to provide a high-speed method of obtaining three-dimensional NMR images.

Briefly, in accordance with the invention, a sequence of excitations are used to rapidly image an object. Between excitations, the magnetization is restored using driven equilibrium. In the imaging of relaxation times the sequence occurs during a relaxation period. Here each signal is processed so as to approximate the signal which would occur if it had been acquired at the desired specific time.

BRIEF DESCRIPTION OF THE DRAWINGS

For a more complete disclosure of the invention, reference may be made to the following detailed description of several illustrative embodiments thereof which is given in conjunction with the accompanying drawings, of which:

FIGS. 2 and 3 are sets of waveforms used in embodiments of the invention;

FIG. 4 is a block diagram of an embodiment of the invention used to correct for differences in sampling time;

DESCRIPTION OF THE PREFERRED EMBODIMENT

Figure 1:
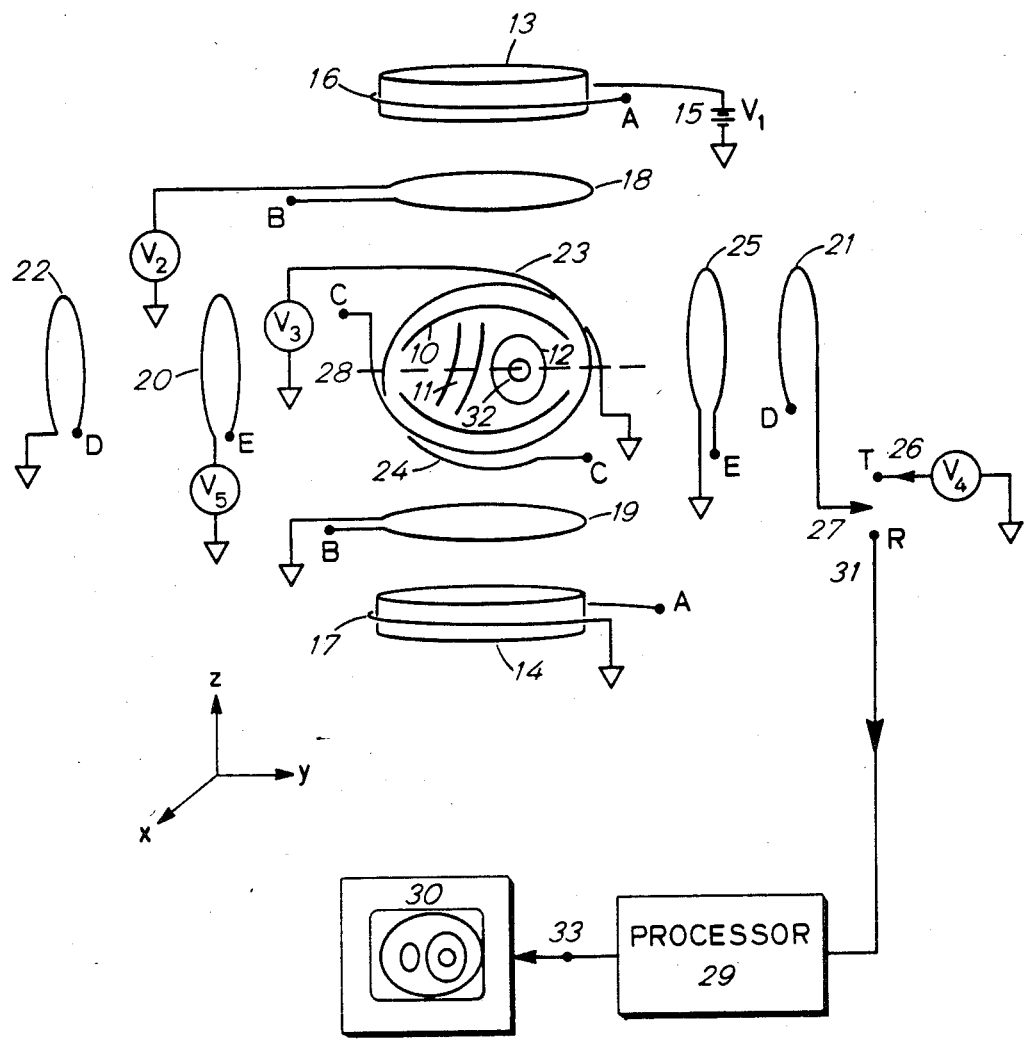
FIG. 1 is a schematic representation of an NMR imaging system used in the invention.

An understanding of the broad aspects of the invention may best be had by reference to FIG. 1. Here it is desired to make a cross-sectional image of volume 10 of the body at level 28. The volume contains many structures such as vessel 11, liver 12 with tumor 32. Many of these structures have significant movement such as respiratory motions which, if the data is not acquired during a breath-holding interval, will result in significant blurring.

The apparatus used in this NMR imaging system is identical to that used in present instruments. For purposes of illustration, the principal axial magnetic field, in the z direction, is produced using pole pieces 13 and 14 excited by coils 16 and 17. These are driven by d.c. source $V_1$ with the coils 16 and 17 producing fields in the same direction to create a substantially uniform field throughout the region of interest in volume 10. This is by far the strongest field in the system with a strength of the order of one to ten kilogauss. With both this coil and the remaining coils, the letter pairs A-E are simply convenient ways of indicating connections.

Specific regions are selected using the gradient coils. Coils 18 and 19 form a gradient field in the z direction driven by source $V_2$. Similarly coils 23 and 24 are on opposite sides of object 10 and thus form a gradient field in the x direction driven by source $V_3$. Coils 20 and 25, driven by source $V_5$, form the y gradient field. Unlike coils 16 and 17 which create a uniform field, these gradient coils are bucking each other so as to produce a varying field in the respective direction.

Coils 21 and 22 are the radio frequency coils serving both the transmitter and receiver function. They produce fields in the same direction to create a substantially uniform field in volume 10. When switch 27 is in the transmit position 26, generator $V_4$, is used to excite the magnetic spins in volume 10. When switch 27 is connected to the receive position, signal 31 is received from magnetic spin signals in volume 10. These are processed in processor 29 to provide a cross-sectional image of volume 10. The resultant cross-sectional image is displayed in display 30. An alternative arrangement is to use separate transmitter and receiver coils and avoid the switching operation.

In a typical system for providing a cross-sectional image, as indicated the previous references, a particular cross-sectional plane, such as plane 28 is selected by applying a gradient in the z direction using $V_2$, and exciting the volume with an rf (radio frequency) pulse $V_4$, with the switch 27 in the transmit position. The frequency of this burst or rf pulse will determine the desired plane. In order to reconstruct an image of the plane, a sequence of projection measurements are made using different transverse gradient arrangements. For example, during the FID (free induction decay) signal following the rf pulse, transverse gradients at all angles are used. These are produced by applying appropriate waveforms to $V_3$ to provide an x gradient component and $V_5$ to provide a y gradient component. Typically, about 180 projections are formed at one degree intervals. Each gradient represents an array of lines, normal to the gradient direction, where each line produces a different frequency. Thus a Fourier transform of the FID, for each transverse gradient direction, provides the projection information corresponding to that direction. $V_3$ and $V_5$ are thus varied following each excitation to provide the complete set of projection data represented by the Fourier transform of each FID. These can be used in any of the classical methods of reconstruction from projections, such as the system of convolution-back projection, to reconstruct the cross-sectional image.

A variety of other sequences of transverse gradient arrangements can also be used to reconstruct the cross-sectional image. Another approach, which has achieved significant popularity, is the spin warp system. Here, instead of taking projections in different directions, the projections are all taken in the same direction. For example, as shown in FIG. 11 of the paper "NMR Imaging Techniques and Applications: A Review," by P. A. Bottomley in the *Rev. Sci. Inslium,* Vol. 53, pp. 1319-1337, Sept. 1982, the x gradient driven by $V_3$ is used during the readout signal, thus decomposing the plane into an array of lines normal to the x axis. For the other dimension $V_5$, driving the y gradient coils, is turned on prior to the received signal so as to "warp" the plane along the y axis. For each rf excitation $V_5$ is sequenced through a range of values which provide cyclical variations in phase along the y axis. Each $V_5$ value, representing a different y gradient, thus produces a cyclical phase variation of a different spatial frequency. A spatial Fourier transform of these values decomposes the data into spatial information in the y direction. Thus the reconstruction process involves a temporal Fourier transform of the FID signals to decompose the x variations and a spatial Fourier transform of the sequence of FID signals to achieve the decomposition in the y direction.

In general, however it must be appreciated that the reconstruction of an n×n cross-sectional image requires approximately n unique transverse gradient arrangements. Two methods, reconstruction from multiple-angle projections and spin-warp have been briefly described for illustrative purposes, although a number of others appear in the literature.

In each of these methods the basic problem necessitating long imaging times is caused by the relaxation phenomenon. For example, in the first excitation we achieve projection data proportional to ρ, the density of magnetic spins. In the next excitation, the plane of interest 28 is recovering from the first excitation resulting in a signal v at terminal 31 given by $$v = \rho[1 - e^{-\tau/T_1}]$$

where τ is the time between excitation and $T_1$ is the spin-lattice relaxation time. For convenience the constant of proportionality has been set to unity. Of course the actual signal received will be the line integral of all of the signals in the projection direction where both ρ and $T_1$ are functions of the spatial dimensions. This integration is not shown, at this point, for purposes of clarification.

Any attempt to make τ relatively small, so that the sequence of excitations will not take an inordinately long time interval, results in a serious loss of signal and therefore of SNR (signal-to-noise ratio). For many body tissues $T_1$ is about 0.5 seconds. If we set $\tau = T_1$, allowing a reasonable recovery of the signal, 200 projections will take approximately two minutes, significantly longer than reasonable breath-holding intervals. It is the principal object of this invention to reduce this long data acquisition period by eliminating the waiting during the relaxation process.

A system for NMR spectrographic material analysis (non-imaging) to reduce the time between exponents is called DEFT (driven equilibrium Fourier transform) and is described on pages 29–30 of the book *Experimental Pulse NMR, A Nuts and Bolts Approach*, by E. Fukushima and S. B. W. Roeder, 1981, published by Addison-Wesley Publishing Company, Inc., Reading, Mass. In this invention, the same basic principal is applied in a new way.

Figure 2:
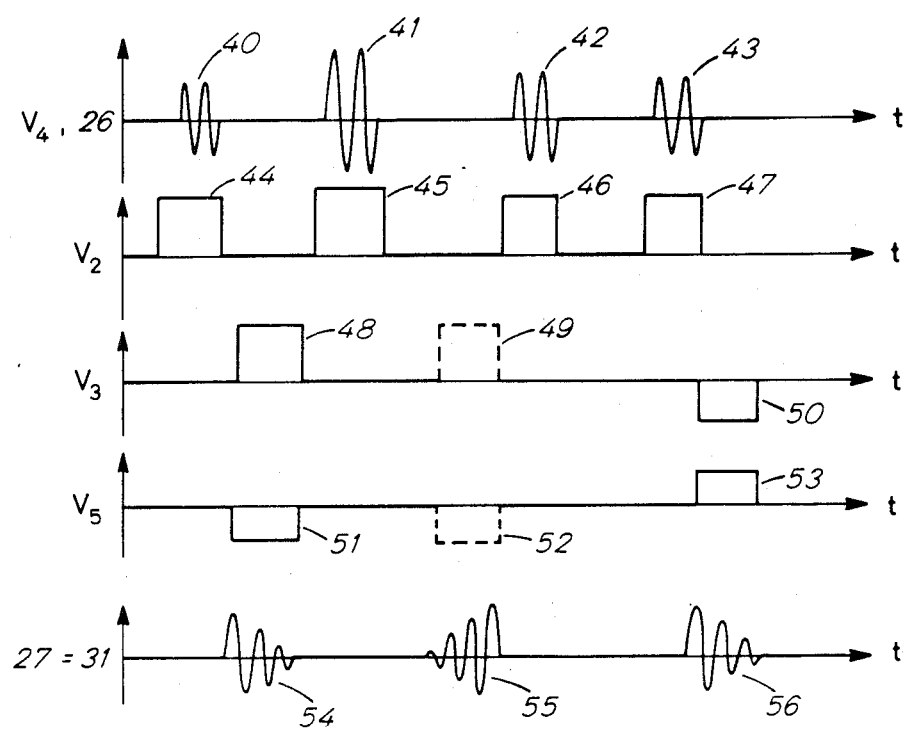

The basic system, applied to cross-sectional imaging using the multiple-angle projection system described in the previously referenced paper by I. R. Young, et al. as an example, is illustrated in FIG. 2. With the switch 27 connected to 26, the transmit position, $V_4$ supplies signal segment 40, a 90° burst to tip the magnetic moment by 90° by virtue of its strength and duration. During this burst $V_2$ provides a z gradient, using signal segment 44, so that only the desired plane, such as plane 28, will be excited. Following the transmitted rf pulse switch 27 is thrown into the receive position providing received signal 31. The classic FID signal, shown as segment 54, is received following the excitation. In order to decompose a particular projection into an array of lines a tranverse gradient arrangement is used using x gradient signal $V_3$ producing signal segment 48 coinciding with y gradient signal $V_5$ producing signal segment 51; the two combining to provide a transverse gradient at a particular angle. Thus received FID signal segment 54 contains frequencies corresponding to the line integrals of the projection at that angle. These individual line integrals are obtained using a Fourier transform of segment 54.

Thusfar the description is that of a conventional cross-sectional NMR imaging system. At this point a wait on the order of one second is usually required before the next excitation involving a different projection angle. Instead, however, we use the system of driven equilibrium to allow an almost immediate reexcitation, as indicated in FIG. 2. Following the decay of the FID, segment 54, a 180° inversion excitation, segment 41 of $V_4$, is applied in the presence of z gradient signal $V_2$ shown as segment 45. This applies the inversion excitation to the same plane 28 that was previously excited. This "re-focuses" the magnetic spins so that they produce a spin echo signal at a time following the inversion excitation equal to the time difference between $V_4$ segments 40 and 41. This spin echo is shown as received signal segment 55. The dotted gradient signal segments 49 and 52 which occur during segment 55 will subsequently be discussed. However, this spin echo segment 55 is not allowed to provide its normal rising and falling envelope. At the peak of the spin echo signal, when the spins are all lined up, the magnetization is rotated back to its original z direction by applying a 90° excitation pulse, segment 42. This is again applied in the presence of a z gradient, segment 46, to insure that the same plane 28 is being excited.

Following this restoration to the equilibrium position, without waiting for a time comparable to $T_1$, the sequence is begun again with excitation segment 43, identical to that of 41, in the presence of the same z gradient, segment 47, to re-excite the same plane. It is now desired to collect projection data at a new angle. Thus the transverse gradient signals $V_3$ and $V_5$ are changed to segments 50 and 53 respectively, representing a new projection angle. Fourier transformation of signal segment 56 provides the projection signal at that new angle, without having waited for a time of approximately 1.0 seconds. The driven equlibrium sequence is thus repeated, using the 180° and 90° excitations to prepare the system for another projection angle using different $V_3$ and $V_5$ signals.

Signal segment 55, representing half of a spin echo signal, can be used to enhance the received signal and thus significantly improve the signal-to-noise ratio. If, as shown in the dotted line segments 49 and 52, the same transverse gradient signals are applied during the spin echo signal segment 55 as were applied during the FID 54, then signal segment 55 will be identical in frequency composition as 54. It can therefore be Fourier transformed and provide the identical projection signals. These would be added together in processor 29 to enhance the signal, and hence the signal-to-noise ratio.

Alternatively, signal segment 55 can be used to increase the speed of the data acquisition system by representing a new transverse gradient arrangement corresponding, in this example, to a new projection angle. In that case gradient signal segments 49 and 52 would necessarily be different from those of 48 and 51, to represent a new projection angle. This operation would reduce the data acquisition time by an important factor of two.

In the driven equilibrium system, as previously described, the magnetic moment is driven back to the z axis at the peak of the spin echo signal, when all of the spins are realigned to the same phase. This operation might be deteriorated somewhat by the use of transverse gradients during the spin echo signal segment 55 since it causes different portions of the plane to produce different frequencies. Therefore, it might be desirable, for a more complete return to equilibrium, to not use any gradient signals during signal segment 55, thus eliminated segments 49 and 52.

The various signals shown in FIG. 2 are presented in a general form and not intended to be scaled in size or shape. For example, the duration of the FID and spin echo segments, 54 and 55 is generally a few milliseconds while those of the burst signals, 40–43, can be considerably less. In addition, the z gradient signals $V_2$ usually have negative going lobes added to provide better phase coherence throughout the thickness of the planar section as shown in the previously referenced paper by I. R. Young, et al. Once planar section 28 has been completed, by acquiring data from a complete set of angles, the frequencies of rf excitation signals 40–43 are changed to address a new planar section, if desired.

The method shown in FIG. 2 of driven equilibrium represents one embodiment of forcing the magnetic moment back to its original state. Other approaches exist including a reversal of the gradient signals 48 and 51 which will also create a spin echo signal. Again, at the peak of this spin echo signal the 90° burst is applied to restore the original magnetization.

The projection imaging sequence of FIG. 2 represents one method of cross-sectional imaging, that of multiple projection angles. As was previously indicated a number of other approaches can be used, all having in common the use of an array of different transverse gradient arrangements to completely define the cross-sectional plane. As another example, FIG. 3 illustrates the waveforms for the spin-echo system, previously referenced. As in FIG. 2, the desired planar section is excited using signal segment 40 in the presence of z gradient signal segment 44. In this case, however, the transverse gradient arrangement for receiving the signals is changed to the spin warp system, as indicated in the previously referenced review by P. A. Bottomley. All of the projections are taken in the y direction, using an x-gradient only during the time the signal is received. Prior to each received signal, however, a different y gradient signal $V_5$ produces different cyclical variations of phase in the y direction, allowing the planar image to be reconstructed. Signal segment 61 represents the signal causing the cyclical phase variations. Signal segment 60 of x gradient signal $V_3$ first goes negative and then positive during the receiving of the signal. The negative segment delays the received signal, producing a spin-echo signal 62 which represents the projection in the y direction, with cyclical phase variations in the y direction. Each projection line, at each x position, produces a different electrical frequency.

As before, following signal 62 it would normally require a wait of the order of 1.0 seconds before re-excitation. However, the same driven equilibrium sequence is applied using the 180° burst, segment 41, in the presence of z gradient signal segment 45, producing spin-echo segment 55. Again, at its peak, burst 42, in the presence of the same z gradient 46, is used to drive the magnetization back along the z axis, allowing the next sequence to begin immediately. This is shown as rf pulse 43 in the presence of the same z gradient segment 47, followed by x gradient signal segment 63. The y gradient signal segment 64 is changed from that of 61 so as to produce a different cyclical phase distribution in the y direction resulting in spin-echo signal 65. Again, using n different such distributions, each with a different y gradient signal $V_5$, the planar section can be reconstructed.

As with FIG. 2 signal segment 55 in FIG. 3 can be used to either enhance the received signal 62 for improved SNR or reduced data acquisition time. In either case the x gradient signal $V_3$ segment 60 or 63 is repeated such that the positive going portion coincides with signal segment 55. Similarly the y gradient signal $V_5$ is repeated in the same timing relationship. However, for enhanced SNR the y segment is made identical to 61, while for reduced data acquisition time it is changed, as with segment 64, to represent a different cyclical variation.

In the methods of FIGS. 2 and 3 rf bursts 41 and 42 are shown as being applied in the presence of z gradient signal segments 45 and 46 respectively in order to concentrate the excitations on the desired plane. The systems can operate, however, without those z gradient signals. Signal segments 41 and 42 can be allowed to excite the entire volume, with signals 40 and 43 providing the planar selection, if care is taken to avoid any signals resulting from other planes in the volume.

The imaging of the entire volume 10 can be accomplished by applying the methods shown in FIG. 2 or 3 to a series of planes parallel to planar section 28. An alternate approach to the imaging of the entire volume 10 is the volumetric system called zeugmatography described in the previously referenced paper by P. V. Lauterbur and C. M. Low. Here, as previously described, arrays of parallel planar integrals are acquired at different angles and then the entire volume is reconstructed. This system can also be the subject of rapid data acquisition through the use of driven equilibrium. This can be simply studied with the aid of FIG. 2, where the z gradient signals $V_2$ as shown are eliminated. Thus rf burst 40, applied without a gradient, excites all of volume 10. The resultant FID, signal segment 54, is received in the presence of various x, y and z gradients which determine the angle of the parallel array of planes. Thus a z gradient signal should be added in time synchronism with signal segments 44 and 51, to represent a generalized gradient. Inversion signal segment 41 is again applied without any gradients, thus inverting the spins in the entire volume. This results in spin-echo signal segment 55. Again, at the peak of this signal, rf burst 42 is applied, again without gradients, to drive the magnetization of the entire volume back to the equilibrium state. This enables the next set of parallel planes to be excited almost immediately using burst 43 in the absence of any gradients. Signal 56 is then received in the presence of a new set of gradient signals represented by x gradient signal 50, y gradient segment 53 and a z gradient segment not shown.

As with the previous embodiments the spin-echo signal 55 can be received in the presence of no gradient, in the presence of the previous gradient set to enhance the SNR, and in the presence of a new gradient set to reduce the data acquisition time.

All of the previous received signals 31 and processed signals 33 discussed thusfar have represented the proton density. It has been found in clinical studies that for some tissue studies the relaxation times $T_1$ and $T_2$ can be equally or more important than the density. It is therefore essential that this rapid data acquisition system be capable of creating images which are sensitive to these relaxation times. One general approach, presently used, for creating images sensitive to $T_1$ is called inversion recovery and is described in the previously referenced book, *Nuclear Magnetic Resonance Imaging In Medicine.* Here a 180° inversion signal inverts the spins, after which they slowly recover toward the positive z axis with a time constant $T_1$, the spin-lattice relaxation time. After a time interval $\tau$, a 90° pulse is applied which essentially samples the magnetization, resulting in an FID signal whose output is given by $$v = \rho[1 - 2e^{-\tau/T_1}]$$

where, as before, a constant of proportionality has been ignored. For the resultant signal v to be maximally sensitive to $T_1$, the sampling time $\tau$ is generally made comparable to $T_1$. As the system is normally used, a series of these excitations are made, each using different gradient configurations. As a result, the system usually has insufficient time to fully recover between excitations, such that the initial magnetization is reduced by a factor $[1 - e^{-t_r/T_1}]$ where $t_r$, the repetition time, is the time between the sampling burst and the next inversion excitation. Clearly, if this is very long as compared to $T_1$, allowing complete recovery, the signal will be as previously given. In general, however, it is given by $$v = \rho[1 - 2e^{-\tau/T_1} + e^{(-t_r + \tau)/T_1}]$$

This same inversion recovery procedure can be used with driven equilibrium to provide a $T_1$ sensitive signal in a small portion of the normally used data acquisition time. One simple example involves the systems illustrated in both FIGS. 2 and 3. The sequences shown are each preceded by an inversion signal at a time of the order of $T_1$ prior to the onset of the sequences shown. This inversion signal can be for example a 180° signal without a gradient, a 180° signal with a gradient, thus exciting the desired plane, or an adiabatic fast passage signal described in many of the previous references including the book *Nuclear Magnetic Imaging in Medicine*. Normally, following the relatively long recovery time, a single projection measurement is obtained, resulting in very long data acquisition times. Here, following the recovery time, a long sequence of projection measurements are taken with different gradient arrangements, using the driven equilibrium sequence between measurements.

One potential problem with the approach described in that each projection measurement will be at a slightly different value of $\tau$. In a system of reconstruction from projections, ideally, every projection involves the region at a given state, otherwise the measurements are inconsistent, resulting in reconstruction artifacts. However, in this case, the measurements are each of the order of milliseconds apart, where $T_1$ is about 0.5 seconds, so that the errors should be relatively small. However, a number of methods are given for minimizing these errors, to insure a relatively distortion-free reconstruction of the $T_1$ dependent signal.

One approach involves making use of the fact that, in a multiple-angle projection system such as that of FIG. 2, each projection is made over the same area. Thus the integral of each of the projections, at each angle, is the same, representing the area of the function. That is, the generalized projection of the function at some angle $v$ can be written as $$g_v = \int_v \rho(x,y) \left[ 1 - 2\exp\left(-\frac{\tau}{T_1(x,y)}\right) \right] dl$$

where $dl$ is the line integral element in the $v$ direction. If we integrate $g_v$ along the projection, normal to $v$, we achieve a constant value representing the area $M$ as given by $$M = \int g_v ds = \int_\perp \int_v \rho(x,y) \left[ 1 - 2\exp\left(-\frac{\tau}{T_1(x,y)}\right) \right] dl ds$$

where the outer integral, as indicated, is taken perpendicular to $v$ with a variable $s$. An elementary indication of this concept can be demonstrated by taking two perpendicular projections, in the x and y directions where $$g(x) = \int \rho(x,y) \left[ 1 - 2\exp\left(-\frac{\tau}{T_1(x,y)}\right) \right] dy$$

and $$g(y) = \int \rho(x,y) \left[ 1 - 2\exp\left(-\frac{\tau}{T_1(x,y)}\right) \right] dx$$

Taking integrals of each in the orthogonal direction it is clear that $$M = \int g(x)dx = \int g(y)dy =$$

$$\int \int \rho(x,y) \left[ 1 - 2\exp\left(-\frac{\tau}{T_1(x,y)}\right) \right] dxdy$$

We make use of this concept to partially correct for projections sampled at different times. We first take a projection at the desired time $\tau$, using the method of FIG. 2 and establish a value of $M_o$ as given by $$M_0 = \int_\perp \int_v \rho(x,y) \left[ 1 - 2\exp\left(-\frac{\tau}{T_1(x,y)}\right) \right] dl ds$$

Any other projection taken at a different time $\tau \pm t$, before or after $\tau$, will not in general have the same area $M_o$, since the components have changed. If we force each projection to have the same area, at least on the average, we will have corrected the projection. Thus each measurement is multiplied by the ratio $M_o/M_i$ where $M_o$ is the area at the specific sampling time $\tau$, and $M_i$ is the area at some other sampling time $\tau \pm t$.

This procedure is illustrated in FIG. 4. When the projection is taken at the desired specific sampling time $\tau$, switch 73 is in position 75. Thus the incoming FID signal is Fourier transformed in 70 to provide its projection information 71. These projection signals are integrated in 72 to obtain $M_o$ and stored in digital store 76. For every other projection occurring at different times switch 73 in position 74. Here each incoming signal is again Fourier transformed to obtain the projection data, which is integrated in 72 to provide the area $M_i$. Ratio system 77 forms the ratio $M_o/M_i$, using the stored and current values. This ratio controls multiplier 78 which multiplies the current projection data by $M_o/M_i$ to provide the desired correction. This projection data is then passed on to reconstructor 79, such as a classical filtered back projection system, where the cross-sectional image is reconstructed. Of course, for the reference projection taken at $\tau$, with switch 73 in position 75, the multiplier 78 is set to unity.

For minimizing the data acquisition time, data will be taken both before and after the desired specific time $\tau$. In this case signal 31 or projection signal 71 can represent the output of the stored sequence of data. The projection corresponding to $\tau$ can then be pulled out of the sequence to create the reference $M_o$ which is then used for times occurring both before and after $\tau$.

As was earlier indicated, the system of FIG. 2 can be used with either planar cross-sectional imaging, using sequences of transverse gradients corresponding to different projection angles or with 3-D volume imaging using sequences of gradients in all dimensions providing parallel arrays of planar integrals.

Similarly the system of FIG. 4 can be used to provide a degree of correction when 3-D volumetric images are desired which are sensitive to relaxation times. Here signal 71 represents the array of planar integral signals with the integrated output from 72 representing the volume. Again the system is calibrated at sampling time $\tau$ to provide $M_o$ which is used to provide correction ratio $M_o/M_i$ for each array of planar integrals.

The systems described provided a signal with $T_1$ dependence, which has been widely shown to be desirable. This signal, however, is sensitive to both $\rho$ and $T_1$, as shown. It is often desirable to isolate the $T_1$ values so that they can be used directly to evaluate disease processes. To accomplish this, a complete reconstruction must be made at a different $\tau$ value, providing two equations with two unknowns, thus isolating $T_1$ and $\rho$. One simple example of this is to simply use the sequence shown in FIG. 2, with $\tau \simeq 0$, without any waiting interval. In that case $\rho(x,y)$, the density only, is reconstructed. If we divide the reconstructed relaxation sensitive image $$\rho(x,y)\left[1 - 2\exp\left(-\frac{\tau}{T_1(x,y)}\right)\right]$$

by $\rho(x,y)$ we obtain a function of $T_1(x,y)$ only. This function is readily manipulated to provide a $T_1(x,y)$ image. Thus two complete sets of projections are used to provide isolated images of $\rho$ and $T_1$, as is presently practiced.

The use of these two sets of projection measurements to isolate $\rho$ and $T_1$ provides an interesting alternative for the correction of projection signals taken at other than the desired time $\tau$. For example, after division by $\rho$ and subtraction of the constant one we are left with solely the exponential portion $\exp[-(\tau+t)/T_1]$. If the magnetization hasn't completely recovered, as previously described, we form the more complex exponential terms $2\exp[-(\tau+t)/T_1]+\exp[-(t_r+\tau+t)/T_1]$. In either case we isolate the exponential portion of each projection measurement. Note that this exponential portion represents $\exp(-t/T_1)$ multiplying the projection signal taken at the desired specific time $\tau$. Therefore, if we could multiply the projection measurement by $\exp(t/T_1)$, we would achieve an exact correction. Obviously $T_1$ cannot be known since it is changing at every point in the region. We can, however, affect an approximate correction by multiplying by $\exp(t/\overline{T}_1)$ where $\overline{T}_1$ is the average or expected value of $T_1$. This is known from previous studies of the same region of the anatomy and is now well-classified.

Figure 5:
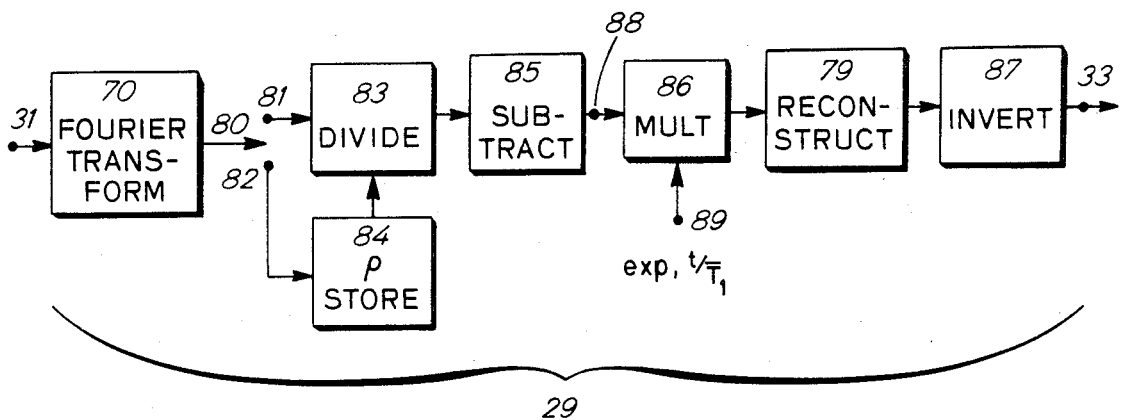
FIG. 5 is a block diagram of an alternate embodiment used to correct for differences in sampling time and to provide an image of the relaxation time.

Referring to FIG. 5, signal 31 is first used with essentially no relaxation interval so as to represent the density $\rho$. With switch 80 in position 82 the transformed projections $\rho$ are stored in store 84. In the next operation a relaxation interval $(\tau+t)$ is used with switch 80 in position 81. Each projection signal, of the form $\rho[1-2e^{-\tau+t/T_1}]$, is divided by the stored value of $\rho$ corresponding to that projection in divider 83. The constant one is then subtracted in subtractor 85 to provide solely the exponential portion. This is then multiplied, in multiplier 86, by $e^{t/\overline{T}_1}$, where t is different for each projection, being zero at the projection corresponding to the desired value $\tau$. Reconstructor 79, as before, using any of the appropriate methods, reconstructs the two-dimensional image of $\exp[-t/T_1(x,y)]$ or that value plus the additional term for incomplete recovery. This can be simply inverted, using logs, in inverter 87 to provide an output signal $T_1(x,y)$, a corrected image of the spin-lattice relaxation time.

One desirable characteristic of the method of FIG. 5 is that it is applicable to different types of data acquisition systems. For example, when using the spin warp system of FIG. 3, the method of constant projection area of FIG. 4 cannot be applied. Rather then dealing with projections at different angles, we are dealing with the same projection angle with different spatial frequencies. These do not have the same area. However, as long as two sets of measurements are made, to isolate $T_1(x,y)$, the general method of FIG. 5 can be used. Similarly, the method of FIG. 5 can also be used with volumetric 3-D imaging of $T_1$ values.

Referring again to FIG. 5, once the exponential portion of the total signal has been isolated, as represented by signal 88, it can also be corrected by the same general method as that of FIG. 4, namely the ratio of the integrals of the projections. This would be a more accurate correction than that of FIG. 4 where the entire signal $\rho[1-2e^{-\tau+t/T_1}]$ is corrected. Only the exponential portion suffers from the error due to the wrong sampling time. Therefore correcting it only, by method of ratio of integrals of projections, provides a more accurate estimate. Signal 88, representing the exponential portion, is applied to integrator 72 in FIG. 4. As before the output of ratio system 77 is $M_o/M_i$. This is now used as signal 89, replacing $e^{t/\overline{T}_1}$, to control multiplier 86 and provide the desired correction.

Figure 6:
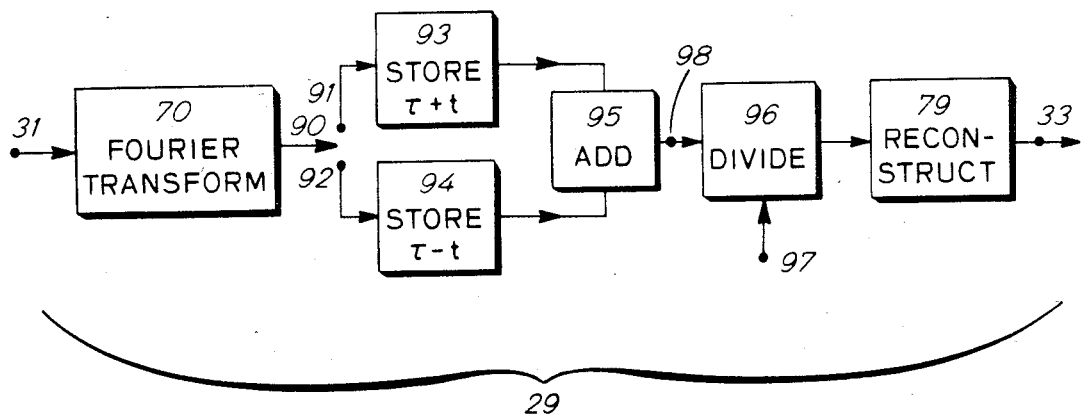
FIG. 6 is a block diagram of an alternate used to correct for differences in sampling time.

The methods of FIGS. 5 and 6 provide approximate overall corrections based on average behavior. Certain errors do, however, remain. A more exact system is illustrated in FIG. 6 which does not require separate measurements for $\rho$ and $\rho[1-2e^{-\tau+t/T_1}]$ as the previous method. This makes use of the powerful concept that $e^{t/T_1}$ is approximately $1+t/T_1$ for values of t small compared to $T_1$. Therefore, for each transverse gradient arrangement, be it in the same projection angle in the system of FIG. 2 or the same spatial frequency in the system of FIG. 3, two measurements are taken. These two measurements, with the identical gradient configuration, are taken equally before and after the desired specific time $\tau$, therefore at times $\tau+t$ and $\tau-t$, using different values of t. The resultant projection signals are added as given by the general form $$\rho[1-2e^{-\tau+t/T_1}]+\rho[1-2e^{-\tau-t/T_1}]=\rho[2-2e^{-\tau/T_1}[e^{-t/T_1}+e^{t/T_1}]]$$

Under the approximation previously given, where $e^{t/T_1}\cong1+t/T_1$, this correction is perfect and the set of measurements at $\tau+t$ and $\tau-t$ corresponds exactly to one taken at the desired specific time $\tau$. This is shown in FIG. 6 where the signals are Fourier transformed in 70 to obtain projection signals both before and after the sampling time $\tau$. Those before, with switch 90 in position 92, are stored in store 94 while those after, with switch 90 in position 91, are stored in store 93. Corresponding measurements, representing the same gradient configuration at $\tau+t$ and $\tau-t$, for each t, are added in adder 95 to provide the corrected projection signal. Ignoring divider 96, the sum signal can be applied directly to reconstructor 79 to create the desired corrected relaxation sensitive image.

In the interest of rapid data acquisition it is desired to collect as many projections as possible in each relaxation period, the ultimate being the collection of all of the measurements in sequence in a single relaxation period. To accomplish this, t is made larger and larger so that the approximation becomes somewhat poorer. Here again the previously described correction systems of FIGS. 4 and 5 can be used to partially correct this residual error as t becomes large. For example, the sum signal 98 can be applied to the integrator of FIG. 4 to derive $M_o$ and $M_i$ for the sum of the projection signals. After deriving the ratio $M_i/M_o$, it can be applied as signal 97 to divider 96 to partially correct the average of each projection.

Similarly as in FIG. 5, two sets of measurements can be taken. A first simply measures projections of $\rho$ using a rapid sequence of measurements without relaxation. These are stored, as previously indicated, in store 84. The second sequence, using relaxation, now uses identical pairs taken at $\tau+t$ and $\tau-t$. These are divided by $\rho$ in divider 83, with the constant subtracted in subtractor 85 to provide exponential signal 88. This exponential only signal is then applied to switch 90, with the values at $\tau+t$ stored in 93 and those at $\tau-t$ stored in 94. When added in 95 they provide a signal of the form $e^{-\tau/T1}[e^{-t/T1}+e^{t/T1}]$. If we further expand the exponential terms to include larger values of t we have $$e^{-t/T1} = 1 - \frac{t}{T_1} + \frac{1}{2}\left(\frac{t}{T_1}\right)^2 - \frac{1}{6}\left(\frac{t}{T_1}\right)^3 + \ldots$$

All will cancel, except for the quadratic term, leaving signal 98 of the form $$e^{-\tau/T1}\left(1 + \frac{t^2}{2T_1^2}\right).$$

Therefore, signal 97 is chosen to be $(1+t^2/2\overline{T}_1^2)$ where again $\overline{T}_1$ is the average or anticipated value of $T_1$. This division again generally corrects the exponential portion of the signal to allow the reconstruction of $\exp[-\tau/T_1(x,y)]$ which can be inverted, using inverter 87 in FIG. 5, to provide $T_1(x,y)$. This method works equally well in the system of incomplete recovery since, as before, the term $\exp[-(t_r+\tau+t)/T_1]$ requires the identical correction factor.

As before, these methods involving the addition of components taken at $\tau+t$ and $\tau-t$ apply equally well to volumetric imaging systems and cross-sectional imaging systems. It should be emphasized that sum signal 98, in addition to providing a correction for the sampling time, significantly increases the SNR because of the pair of measurements taken at the same gradient conditions.

The description thusfar has focused primarily on the $T_1$ or spin-lattice relaxation time. It applies equally well, however, to the measurement of $T_2$, the spin-spin relaxation time. In general $T_2$ measurements are accomplished, as indicated in the previously referenced text *Nuclear Medicine Imaging In Medicine*, using a 90° excitation followed a delay time $\tau$ at which time 180° inversion excitation is applied. This inversion excitation replaces the various spins, which have become dephased, such that they form a spin echo signal at a time $\tau$ from the time of the inversion excitation. This spin echo signal can be represented by signal segment 55 in FIGS. 2 and 3, ignoring the signals preceding that time interval. As shown in both FIGS. 2 and 3, when spin echo signal 55 reaches its peak, the system is driven to equilibrium using burst 42. Following this a series of projection measurements are taken in rapid succession as previously described. The remaining magnetization, after the initial 90° pulse, is determined by the relaxation due to the interaction between the spinning nuclei, or $T_2$ the spin-spin relaxation time. Thus the amplitude of signal 55, and subsequent signals, is approximated by $$v = \rho e^{-2\tau/T2}$$

where, as before, constant proportionality factors are ignored.

As with $T_1$, we wish to make an array of projection measurements to either create an image with $T_2$ sensitivity, such as $\rho(x,y)\exp[-2\tau/T_2(x,y)]$, or make an image of $T_2(x,y)$ itself. The latter, as previously described for $T_1$, requires an additional set of projection measurements, such as a set in the absence of relaxation to first measure $\rho$. We again face the problem that each projection measurement is taken at a slightly different time $\tau \pm t$. The compensation for these errors precedes exactly as previously outlined using FIGS. 4, 5 and 6.

Using the system of FIG. 4 the integral of the projection $M_i$ at each time can be compared to that at the desired time $\tau$, $M_o$, to form the ratio $M_o/M_i$ which multiplies each projection prior to reconstruction. The method of FIG. 5 becomes somewhat simpler when dealing with $T_2$ measurements since the initial signal itself is exponential, without being added to constant terms. Thus the output of the Fourier transform 70, the projection signals, can be applied directly to multiplier 86, followed by the reconstruction operation. The multiplying factor 89, in this case, in multiplier 86 is $\exp(2t/\overline{T}_2)$ where $\overline{T}_2$ is, as before, the average or anticipated value of $T_2$. This, when reconstructed in 79, provides the image $\rho(x,y)\exp[-2\tau/T_2(x,y)]$ with dependence on both density and $T_2$.

If it is desired to image $T_2$ in isolation, we first place switch 80 in position 82 and then follow the sequences of FIGS. 2 and 3, without relaxation. This provides the projections of $\rho$ which are stored in 84. Then, with the switch in position 81, we use the same sequences with the $T_2$ relaxation procedure previously described. Division by $\rho$ in divider 83 eliminates the $\rho$ dependence. Subtractor 85 is eliminated since constant terms are not present. We then go through 86 and 79 as just described to develop an image $\exp[-2\tau/T_2(x,y)]$ with $\rho$ eliminated. Inverter 87, a log operation, as before provides $T_2(x,y)$.

The more exact correction system is again shown in FIG. 6 where sets of measurements are taken at times $\tau-t$ and $\tau+t$ from the inversion burst. The resultant projection signals, this time sensitive to $T_2$, are stored as before in stores 93 and 94 and added in 95 to provide corrected projection signal 98. This can be applied directly to reconstructor 79 to provide the desired image 79. Alternatively, analogous to the previously described $T_1$ processing system, this sum 98 can be subjected to further correction using divider 97. Here the dividing signal can be $M_i/M_o$, derived as previously described where the sum signal 98 is used with integrator 72 to form $M_o$ and $M_i$, the integrated projection signals at $\tau$ and $\tau+t$. The division signal 98 can also be $(1+t^2/2\overline{T}_2^2)$, using the same derivation as before, where the correction is based on the average value of $T_2$. As before, these $T_2$ dependent images can be cross-sectional, using the data acquisition processes shown in FIGS. 2 and 3, or can be volumetric imaging where the plane selection gradient in FIG. 2 is eliminated and three-dimensional gradient configurations are used.

In the foregoing description material each projection, with a specific transverse gradient arrangement, was acquired once, with the exception of FIG. 6 where each projection is acquired twice, at $\tau+t$ and $\tau-t$, to compensate for the sampling time. However, repeated measurements of the same projection, using the same transverse gradient arrangement, can be made in order to improve the SNR. This is an important parameter in NMR imaging and often determines the ability to visualize disease processes. In existing NMR systems repeating projections is impractical since it is required to wait a relatively long time between excitations for the magnetization to adequately recover. However, using the techniques of driven equilibrium, these excitations can be made in relatively rapid succession. For example, in FIG. 2, instead of changing the transverse gradient signals to those shown as segments 50 and 53, the previous transverse gradient signals 48 and 51 can be repeated, with identical signals 54 and 56 combined to enhance the SNR. Similarly, using the spin-warp system of FIG. 3, gradient signal segment 64 can be replaced so as to repeat that of 61. In each case, following one or more repeats of the previous transverse gradient arrangement, a new transverse gradient is employed.

This method of improving the SNR using repeated measurements of a given projection, using driven equilibrium, can also be applied to the projection imaging of a value as described in pending application Ser. Nos. 332,925 and 332,926 by the same inventor. Here projections are made at a given angle, where each projection is of a different parallel planar region of the volume. This can be accomplished using the system of FIG. 2 where, following the collection of a series of projections at a given plane at a given angle, burst segment 43 is changed in frequency to excite a new parallel xy plane. All of the transverse gradients signals, such as 48 and 51, would be repeated and not changed, since the projection angle remains unchanged. In fact, only an x or y gradient coil is required, not both, since we need to project in one direction only.

Following a series of measurements of one plane, with the projection signals combined to enhance the SNR, the frequency of the $V_4$ burst is changed to excite the next plane, with the process repeated. This can be particularly important in projection systems where, without this approach, each portion of the volume is subject to a single excitation, with the resultant low SNR.

In many existing cross-sectional NMR imaging systems, the instruments make use of the unused period between excitations to image other parallel sections. Thus, while a given planar section is undergoing relaxation, another is excited. This can also be done in this invention since, in those approaches involving relaxation, the entire period may not be taken up with excitation and reception of signal. For example, if one third of the period is made up of successive excitations, then three sections can be acquired simultaneously. Of course, using this invention, these would all be done in much less time.

In each of the embodiments a driven equilibrium sequence is used to rapidly restore the initial magnetization. In many cases, due to a variety of system inaccuracies, the restoration will not be complete. In that case the subsequent received signals will be of somewhat lower amplitude. This can readily be compensated for by simply increasing the gain of the system following each projection measurement. The amount of increased gain required can be precalibrated using a known object.

In summary, this application thusfar has disclosed a system for using driven equilibrium to enable a rapid sequence of measurements without waiting for intervals comparable to the relaxation time. In addition, this system was applied to obtaining signals sensitive to the relaxation times by using this same sequence during the relaxation process. In those cases problems would normally be encountered since each measurement represents a slightly different sample during the relaxation process. To undo this problem a number of generalized methods were presented for processing each projection signal so that they all represent samples that are comparable to those taken at the desired specific sampling time.

Figure 7:
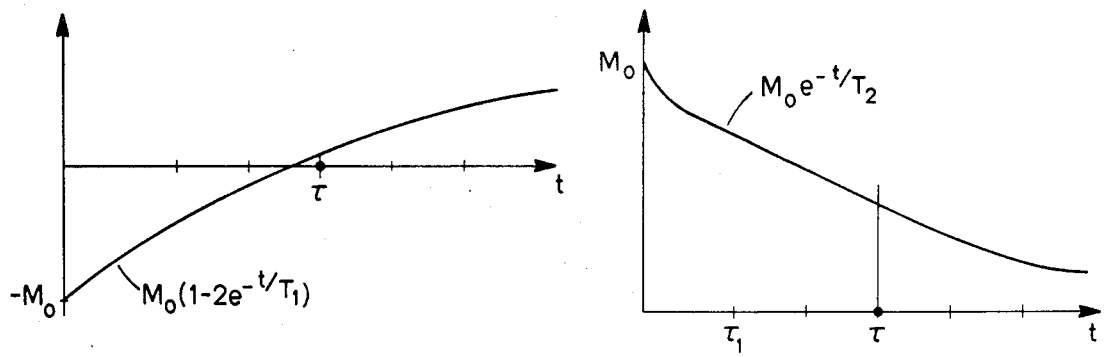
FIG. 7 includes waveforms illustrating the sequence of acquisitions occurring during relaxation procedures.

This is summarized in FIG. 7 where an inversion recovery and a spin-echo recovery are shown. In the inversion recovery, as previously described, an inversion excitation is used with the magnetization M recovering as $$M = M_o[1 - 2e^{t/T_1}]$$

as shown in FIG. 7. Assume the specific desired time to make the measurement is $\tau$ as shown. The sequence of excitations, representing those shown in FIGS. 2 and 3, are shown in the series of marked off intervals on either side of the time $\tau$. Again, using the methods of FIGS. 4, 5 and 6, each of these excitations are made to correspond with that of time $\tau$ so that relaxation sensitive signals can be rapidly acquired.

A similar sequence is shown in FIG. 7 for a spin-echo recovery using the classic $90°$-$\tau_1$-$180°$ excitation. The sequence is shown for the time following the $180°$ excitation where the magnetization follows the curve $$M = M_o e^{-t/T_2}$$

with the initial spin echo occurring at $\tau_1$ and where $\tau$ is again the desired sampling time. Each measurement of the sequence is again made to correspond with $\tau$, using the methods of FIGS. 4, 5 and 6.

Figure 8:
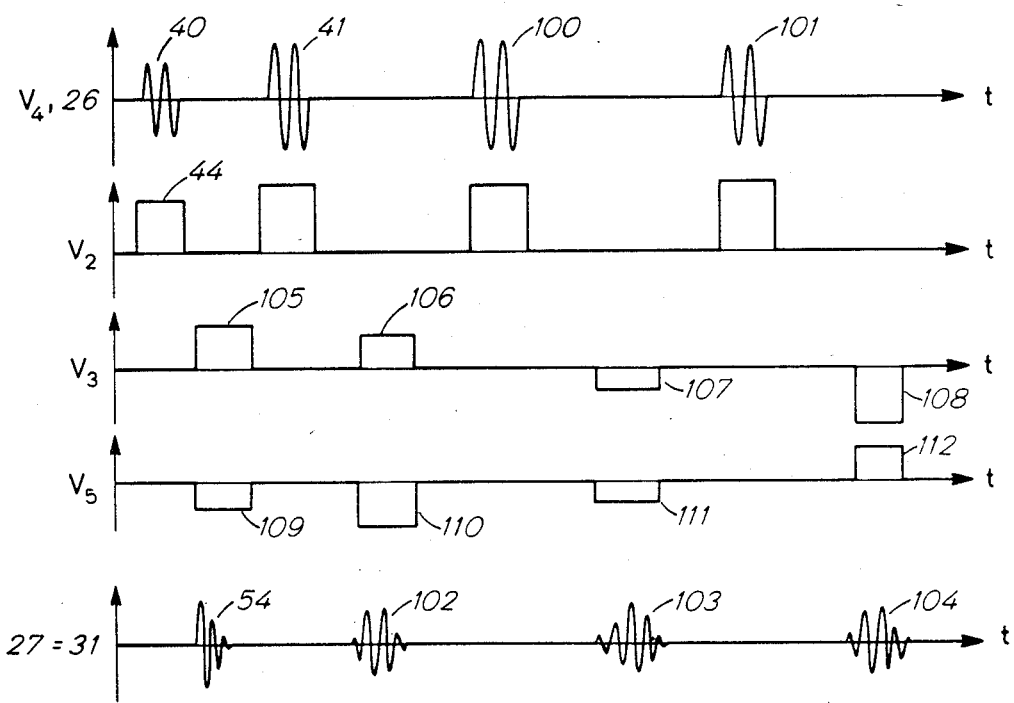
FIG. 8 is a set of waveforms illustrating successive spin-echo signals.

It must be emphasized that these compensating techniques can also be applied to any approach using a sequence of measurements during a relaxation period. Although only the driven equilibrium method has been disclosed thusfar, another method for providing a rapid sequence of measurements is described in a paper by Z. H. Cho, et al. entitled "Fourier Transform Nuclear Magnetic Resonance Tomographic Imaging," *Proc. of the IEEE*, Vol. 70, October 1982, pp. 1152–1173. In this paper a method of repeated spin-echoes is described, in conjunction with a number of basic imaging approaches. As is shown, for example, in FIG. 21 of that paper and in FIG. 8 of this application, following the selection of a plane using a z gradient and a $90°$ pulse, a series of $180°$ invention bursts are used for the rf excitation. Each of these produces the classic spin-echo signal. However, each is used with a different transverse gradient, as shown in FIG. 8, so that the spin-echo represents different projection angles. As with the system of driven equilibrium, this allows data to be collected more rapidly. The spin-echo signals decay, however, with a $T_2$ time constant as illustrated in FIG. 21 of the paper by Z. H. Cho.

Referring to FIG. 8, the plane selection is accompanied using $90°$ burst 40 along with z gradient signal 44. This results in FID signal 54 which, in the presence of transverse gradient signals 105 and 109 represents a specific projection angle. This is followed by a sequence of $180°$ inversion pulses 41, 100, 101, etc. each with different transverse gradient signal segment pairs 106, 110 and 107, 111 and 108, 112 respectively. Thus spin-echo signals 102, 103 and 104, when Fourier transformed represent the desired projection at different angles.

This same general approach, using repeated spin-echoes, can be applied to the spin warp imaging system of FIG. 3. Here each transverse gradient signal pair, $V_3$ and $V_5$ in FIG. 8, is replaced by the $V_3$, $V_5$ sequence shown in FIG. 3 where, $V_5$ is varied prior to each spin-echo and $V_3$ is a fixed repeated waveform which is negative prior to the spin-echo and positive thereafter.

The method described and shown in the Cho paper allows more rapid acquisition of density information, but not signals sensitive to relaxation times since each projection would represent a somewhat different time and result in errors. Therefore, all of the previously shown processing methods from FIGS. 4–6 can be applied to this multiple spin-echo method of rapid sequencing of FIG. 8 to allow for the measurement of relaxation times. Thus the sequences shown in FIG. 8 become the sequence intervals of FIG. 7. The procedure is exactly as previously described except that during a relaxation from an inversion recovery, or a 90°-$\tau_1$-180° sequence, the series of multiple spin-echoes of FIG. 8 are used instead of the driven equilibrium system.

Thus, as in FIG. 4, each processed spin-echo projection signal from FIG. 8 is multiplied by $M_o/M_i$ in multiplier 78, prior to reconstruction to help correct for the error in sampling time. Similarly in FIG. 5, the exponential portion of the processed projection signal is multiplied by $e^{t/\overline{T}1}$ or $e^{2t/\overline{T}2}$, depending on which of the relaxation processes is used, to partially correct for the error. For more exacting correction pairs of spin-echoes at $\tau+t$ and $\tau-t$ are used, and processed as in FIG. 6. To further correct this system the processed signal 98 is divided by either $$\left(1 + \frac{t^2}{2\overline{T}_1^2}\right) \text{ or } \left(1 + \frac{t^2}{2\overline{T}_2^2}\right)$$

as before. Similarly, signal 97 can be the ratio of the integrals $M_i/M_o$, as previously described. Thus the methods for dealing with sequences of projections during the relaxation periods can be applied to any repeated sequence of projection signals.

In FIG. 8 the various spin-echoes were produced using 180° inversion bursts 41, 100, and 101. An alternate method of producing spin-echo signals, well-known and described in the previously referenced literature, is that of alternating the gradient polarity. Referring to FIG. 8, following segment 54, instead of burst 41, during that same time interval the transverse gradients $V_3$ and $V_5$, signal segments 105 and 109, are reversed. This reversal will also create a spin-echo, since the relative frequency of each nuclei is reversed with respect to the center frequency. This is repeated for the subsequent spin echoes, all without the 180° bursts of $V_4$ and without the z gradient signal $V_2$.

What is claimed is:

1. In a method for providing an NMR image of a region using a sequence of rf excitations each involving a different field providing an array of received signals which are processed to form projection signals the steps of:
   exciting the region with an rf inversion pulse following the decay of the received signal; and
   driving the magnetization in the region back to equilibrium between rf excitations by exciting the region with an rf pulse occurring at the peak of the received spin-echo signal providing a tipping angle of substantially 90°.

2. The method as described in claim 1 where the region is a cross-section of a volume including the steps of:
   applying a first magnetic gradient of varying amplitude at each sequence prior to the time of receiving signals;
   applying a second magnetic gradient of fixed amplitude at each sequence during the time of receiving signals whereby the projections are all in the same direction; and
   processing the projection signals to produce a cross-sectional image.

3. In a method for providing an NMR image of a region using a sequence of rf excitations each involving a different field providing an array of received signals which are processed to form projection signals, the steps of driving the magnetization in the region back to equilibrium between rf excitations, the sequence of excitations occurring during a relaxation period of the nuclei in the region, and processing the array of projection signals so that they substantially represent the signals that would occur at a specific time.

4. The method as described in claim 3 wherein the step of driving the magnetization back to equilibrium includes the steps of:
   exciting the region with an rf inversion pulse following the decay of the received signal; and
   exciting the region with an rf pulse occurring at the peak of the received spin-echo signal providing a tipping angle of substantially 90°.

5. The method as described in claim 3 where the step of processing the signals includes the step of multiplying the projections signals by the ratio of the integral of the signals occurring substantially at the specific time to the integral of the projection signals.

6. The method as described in claim 3 where the step of processing the signals includes the step of multiplying the exponential portion of the projection signals by the ratio of the integral of the exponential portions of the projection signals occurring substantially at the specific time to the integral of the exponential portions of the projection signals.

7. The method as described in claim 3 where the sequence of excitations includes pairs of excitations each having the same gradient field with each excitation occurring substantially equally before and after the specific time and where the step of processing includes the step of adding the projection signals resulting from each excitation pair.

8. The method as described in claim 7 including the step of multiplying the added projection signals by the ratio of the integral of the projection signals occurring substantially at the specific time to the integral of the added projection signals.

9. The method as described in claim 7 including the step of multiplying the exponential portion of the added projection signals by the ratio of the integral of the exponential portion of the projection signals occurring substantially at the specific time to the integral of the exponential portion of the added projection signals.

10. The method as described in claim 3 where the step of processing includes the step of multiplying the exponential portion of the projection signals by a function of the average relaxation time.

11. In a method for producing a cross-sectional planar image of an object using nuclear magnetic resonance the steps of:
    exciting the magnetization of a plane of the object in the presence of a magnetic gradient normal to the plane;

receiving rf signals from the nuclear spins in the plane using a first transverse gradient arrangement;

processing the received rf signals to produce projection signals;

exciting the plane with an rf inversion excitation to produce a spin echo signal;

driving the magnetization in the plane back to equilibrium by exciting the plane with an rf pulse during the peak of the spin echo signal;

repeating the sequence using different transverse gradient arrangements; and reconstructing the cross-sectional image using the projection signals.

12. The method as described in claim 11 where the steps of receiving rf signals with different transverse gradient arrangements includes the steps of:

applying a first magnetic gradient of varying amplitude at each sequence prior to the time of receiving signals; and applying a second magnetic gradient of fixed amplitude at each sequence during the time of receiving signals whereby the projections are all in the same duration.

13. In a method for producing a cross-sectional planar image of an object using nuclear magnetic resonance the steps of:

exciting the magnetization of a plane of the object in the presence of a magnetic gradient normal to the plane;

receiving rf signals from the nuclear spins in the plane using a first transverse gradient arrangement;

processing the received rf signals to produce projection signals;

driving the magnetization in the plane back to equilibrium;

repeating the sequence using different transverse gradient arrangements; the sequence of excitations occurring during a relaxation period of the nuclei in the plane, and processing the array of projection signals so that they substantially represent the signals that would occur at a specific time; and reconstructing the cross-sectional image using the projection signals.

14. The method as described in claim 13 where the step of driving the magnetization back to equilibrium includes the steps of:

inverting the nuclear spins in the plane following the decay of the received signal; and exciting the plane with an rf pulse occurring at the peak of the received spin echo signal providing a tipping angle of substantially 90°.

15. The method as described in claim 13 where the step of processing the signals includes the step of multiplying the projection signals by the ratio of the integral of the projection signals occurring substantially at the specific time to the integral of the projection signals.

16. The method as described in claim 13 where the step of processing the signals includes the step of multiplying the exponential portions of the projection signals by the ratio of the integral of the exponential portions of the projection signals occurring substantially at the specific time to the integral of the exponential portions of the projection signals.

17. The method as described in claim 13 where the sequence of excitations includes pairs of excitations each having the same transverse gradient arrangement with each excitation occurring substantially equally before and after the specific time and where the step of processing includes the step of adding the projection signals resulting from each excitation pair.

18. The method as described in claim 17 including the step of multiplying the added projection signals by the ratio of the integral of the projection signals occurring substantially at the specific time to the integral of the added projection signals.

19. The method as described in claim 17 including the step of multiplying the exponential portions of the added projection signals by the ratio of the integral of the exponential portions of the projection signals occurring substantially at the specific time to the integral of the exponential portions of the added projection signals.

20. The method as described in claim 13 where the step of processing includes the step of multiplying the exponential portion of the projection signals by a function of the average relaxation time.

21. In a method for providing three-dimensional image information about the nmr activity of an object the steps of:

exciting an array of parallel planes of the object;

receiving signals from the nuclear spins in each of the parallel planes using a gradient field normal to the planes;

processing the received signals to produce planar integral signals;

driving the magnetization in the volume to equilibrium;

repeating the sequence using arrays of parallel planes at different angles with associated gradient fields normal to the planes; and reconstructing the three-dimensional image information using the planar integral signals from all of the arrays of parallel planes.

22. In a method for providing three-dimensional image information about the nmr activity of an object the steps of exciting an array of parallel planes of the object;

receiving signals from the nuclear spins in each of the parallel planes using a gradient field normal to the planes, processing the received signals to produce planar integral signals;

driving the magnetization in the volume to equilibrium;

repeating the sequence using arrays of parallel planes at different angles with associated gradient fields normal to the planes, the sequence of excitations occurring during a relaxation period of the nuclei in the object and processing the array of planar integral signals so that they substantially represent the signals that would occur at a specific time; and reconstructing the three-dimensional image information using the planar integral signals from all of the arrays of parallel planes.

23. The method as described in claim 22 where the step of driving the magnetization back to equilibrium includes the steps of:

inverting the nuclear spins in the object following the decay of the received signal; and exciting the object with an rf pulse at the peak of the received spin-echo signal providing a tipping angle of substantially 90°.

24. The method as described in claim 22 where the sequence of excitations includes pairs of excitations each having the same gradient field with each excitation occurring substantially equally before and after the specific time and where the step of processing includes the step of adding the planar integral signals resulting from each excitation pair.

25. Apparatus for providing an image of the nmr activity in a region comprising:
   means for providing a sequence of rf excitations each involving a different magnetic gradient to provide an array of received signals;
   means for exciting the region with an rf inversion pulse following the decay of the received signal;
   means for driving the magnetization resulting from the rf excitations back to equilibrium between rf excitations by exciting the region with an rf pulse occurring at the peak of the received spin-echo signal providing a tipping angle of substantially 90°; and
   means for reconstructing the image of the region using the array of projection signals.

26. Apparatus for providing an image of the nmr activity in a region comprising:
   means for providing a sequence of rf excitations each involving a different magnetic gradient to provide an array of received signals;
   means for processing the received signals to form an array of projection signals;
   means for driving the magnetization resulting from the rf excitations back to equilibrium between rf excitations, the sequence of rf excitations occurring during a relaxation period of the nuclei in the region;
   means for processing the array of projection signals so that they substantially represent signals that would occur at a specific time; and
   means for reconstructing the image of the region using the array of projection signals.

27. Apparatus as described in claim 26 wherein the means for driving the magnetization back to equilibrium includes:
   means for exciting the region with an rf inversion pulse following the decay of the received signal; and
   means for exciting the region with an rf pulse occurring at the peak of the received spin-echo signal providing a tipping angle of substantially 90°.

28. Apparatus as recited in claim 27 including means for applying magnetic gradients during the received spin-echo signal such that the spin-echo signal represents the same projection signal as that of the previously received signal whereby the signal is enhanced.

29. Apparatus as recited in claim 27 including means for applying different magnetic gradients during the received spin-echo signal such that the spin-echo signal represents a different projection signal whereby fewer excitations are required to form the required array of projection signals.

30. Apparatus as described in claim 26 wherein the means for processing the projection signals includes means for multiplying the projection signals by the ratio of the integral of the projection signals occurring substantially at the specific time to the integral of the projection signals.

31. Apparatus as described in claim 26 wherein the means for processing the projection signals includes means for multiplying the exponential portions of the projection signals by the ratio of the integral of the exponential portions of the projection signals occurring substantially at the specific time to the integral of the exponential portions of the projection signals.

32. Apparatus as described in claim 26 wherein the means for processing the projection signals includes means for multiplying the exponential portion of the projection signals by a function of the average relaxation time.

33. Apparatus as described in claim 26 including an additional sequence of rf excitations having the same set of magnetic gradients as those of the first sequence forming pairs of excitations having the same magnetic gradient with each of the pairs occurring substantially equally before and after the specific time and where the means for processing includes means for adding the projection signals resulting from each excitation pair.

34. Apparatus as described in claim 33 including means for multiplying the added projection signals by the ratio of the integral of the projection signals occurring substantially at the specific time to the integral of the added projection signals.

35. Apparatus as described in claim 33 including means for multiplying the exponential portion of the added projection signals by the ratio of the integral of the exponential portion of the added projection signals occurring substantially at the specific time to the integral of the exponential portion of the added projection signals.

36. Apparatus as described in claim 26 wherein the region is a planar section and the projection signals represent line integrals of the planar section.

37. Apparatus as described in claim 36 wherein the different magnetic gradients include different transverse gradient fields parallel to the planar section and each pointing in different angles and where the means for reconstructing the image includes means for reconstruction from multiple angle projections.

38. Apparatus as described in claim 36 wherein the different magnetic gradients include a transverse gradient parallel to the planar section during the time signals are received preceded by an orthogonal transverse gradient of different amplitudes and where the means for reconstructing the image includes Fourier transformation.

39. Apparatus as described in claim 26 wherein the region is a volume and the projection signals represent planar integrals of the volume.

40. Apparatus as recited in claim 26 wherein the relaxation period follows an inversion excitation whereby the received signals include functions of $T_1$, the spin-lattice relaxation time constant.

41. Apparatus as recited in claim 26 wherein the relaxation period follows an excitation of substantially at 90° tipping angle followed by an inversion excitation whereby the received signals include functions of $T_2$, the spin-spin relaxation time.

42. Apparatus as recited in claim 26 including means for repeating each of the rf excitations using the same magnetic gradient and means for combining the projection signals representing each magnetic gradient whereby the signal is enhanced.

43. In a method for producing an image sensitive to the NMR relaxation times of a region the steps of:
   acquiring a sequence of projection measurements of the region during a single relaxation period;
   processing the projection measurements such that they substantially represent the projection measurement that would have occurred at a specific time; and reconstructing the processed projection measurements into an image sensitive to the relaxation times of the region.

44. The method as described in claim 43 wherein the step of processing includes the steps of multiplying each projection measurement by the ratio of the integral of the projection measurements taken at the specific time to the integral of the projection measurements.

45. The method as described in claim 43 wherein the step of processing includes the step of multiplying the exponential portion of the projection measurements by a function of the average relaxation time.

46. The method as described in claim 43 where the sequence of projection measurements includes pairs of measurements taken under substantially identical conditions with each measurement occurring substantially equally before and after the specific time and the step of processing includes the step of adding the projection measurements resulting from each measurement pair.

47. The method of claim 46 including the step of multiplying the added projection measurements by the ratio of the integral of the projection measurements occurring substantially at the specific time to the integral of the added projection measurements.

48. The method as described in claim 46 including the step of multiplying the exponential portion of the added projection measurements by the ratio of the integral of the exponential portion of the projection measurements occurring substantially at the specific time to the integral of the exponential portion of the added projection signals.

49. Apparatus for providing an image sensitive to the NMR relaxation times of a region comprising:

means for acquiring a sequence of projection measurements of the region during a single relaxation period;

means for processing the projection measurements such that they substantially represent the projection measurements that would have occurred at a specific time; and means for reconstructing the relaxation time-sensitive image using the processed projection measurements.

* * * * *